United States Patent [19]
Lee et al.

[11] Patent Number: 5,386,087
[45] Date of Patent: Jan. 31, 1995

[54] PRINTED CIRCUIT BOARD HAVING U-SHAPED SOLDER MASK LAYER SEPARATING RESPECTIVE CONTACTS

[75] Inventors: Chen W. Lee; Fong P. Chang; Chou L. Chen, all of Chung-li, Taiwan, Prov. of China

[73] Assignee: E. I. Du Pont de Nemours and Company, Wilmington, Del.

[21] Appl. No.: 17,921

[22] Filed: Feb. 16, 1993

[30] Foreign Application Priority Data

Feb. 17, 1992 [JP] Japan .................. 4-006211[U]

[51] Int. Cl.⁶ ............................................ H05K 1/09
[52] U.S. Cl. ...................... 174/261; 361/767; 174/250
[58] Field of Search .............. 174/255, 261, 260, 250; 361/767, 772, 774

[56] References Cited

U.S. PATENT DOCUMENTS

| | | | |
|---|---|---|---|
| 4,132,341 | 1/1979 | Bratschun | 228/122 |
| 4,295,183 | 10/1981 | Miersch et al. | 361/403 |
| 4,755,631 | 7/1988 | Churchwell et al. | 174/68.5 |
| 4,767,892 | 8/1988 | Koban | 174/68.5 |
| 4,893,216 | 1/1990 | Hagner | 361/406 |
| 4,965,702 | 10/1990 | Lott et al. | 361/401 |
| 5,266,748 | 11/1993 | Kawakami et al. | 174/262 |

OTHER PUBLICATIONS

Patent Abstracts of Japan, vol. 16, No. 27 (E-1158) 23 Jan. 1992 & JP-A-32 41 888 (Toshiba Corp) 29 Oct. 1991 *Abstract*.
Patent Abstracts of Japan, vol. 13, No. 176 (E-749) Apr. 1989 & JP-A-10 05 096 (Brother Ind Ltd) 10 Jan. 1989 *Abstract*.

*Primary Examiner*—Leo P. Picard
*Assistant Examiner*—L. Thomas
*Attorney, Agent, or Firm*—Woodcock Washburn Kurtz Mackiewicz & Norris

[57] ABSTRACT

A circuit pattern layer is formed over the surface of a laminated board such that it includes one array of solder pads. The circuit pattern layer has its surface covered with a solder mask layer. The solder mask layer has a U-shaped recess at the area of the solder pad. The solder pad is exposed at the area of the U-shaped recess. Upon the soldering of the connector's connection terminal to the solder pad at the area of the U-shaped recess, a molten solder is kept in the U-shaped recess and prevented from flowing onto the adjacent connection terminal. It is thus possible to prevent a solder bridge from being created across those connection terminals.

3 Claims, 5 Drawing Sheets

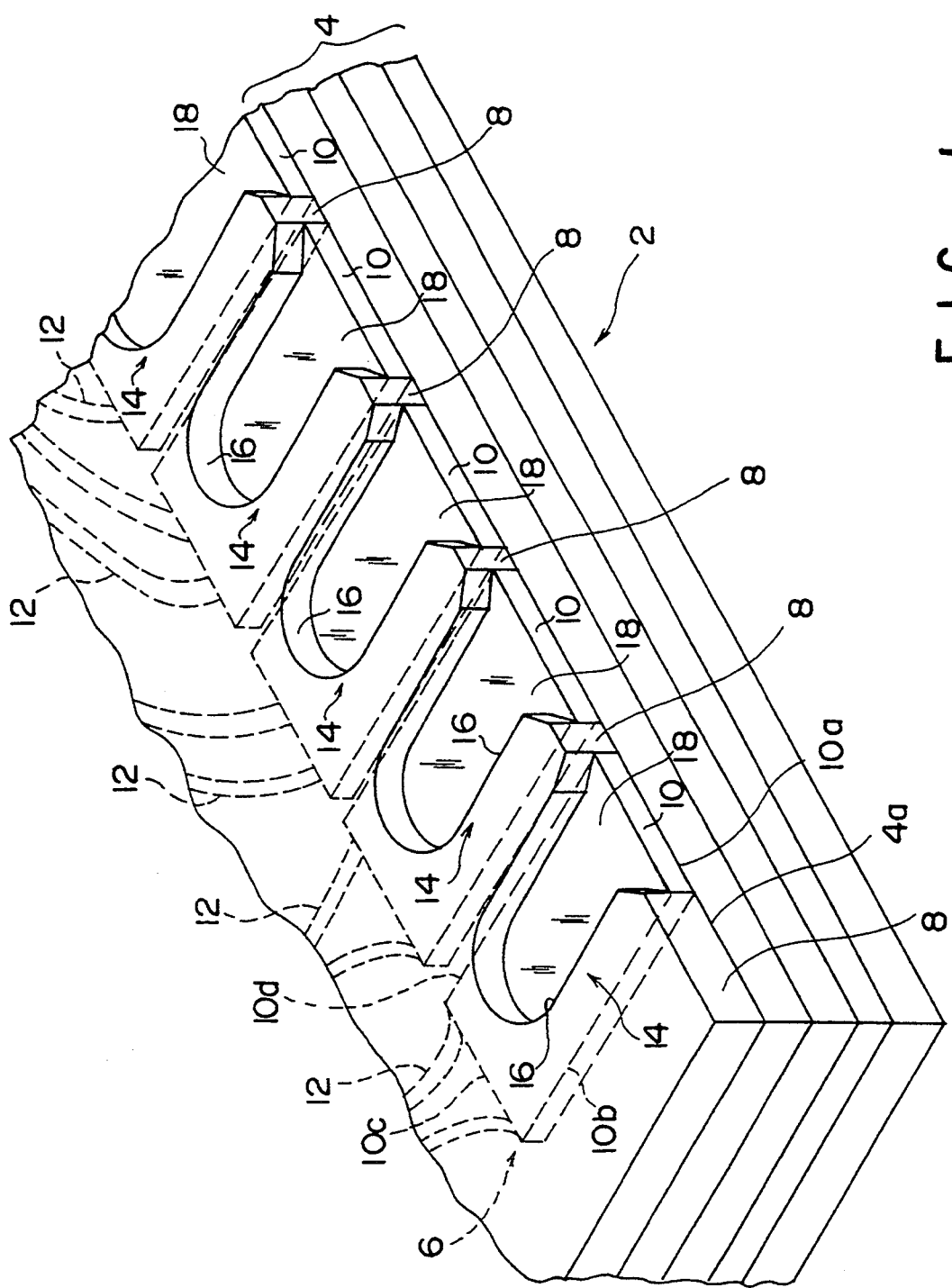
F I G. 1

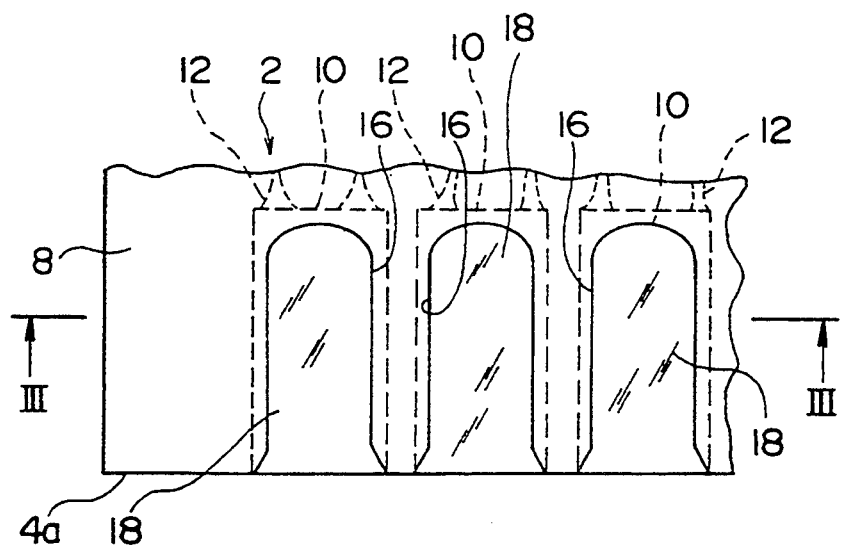
F I G. 2
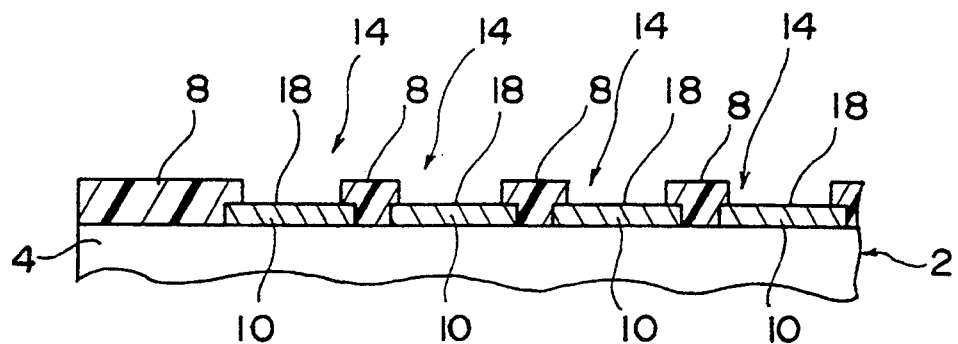
F I G. 3

PRINTED CIRCUIT BOARD HAVING U-SHAPED SOLDER MASK LAYER SEPARATING RESPECTIVE CONTACTS

BACKGROUND OF THE INVENTION

1. Field of the Invention

The present invention relates to a printed circuit board and, in particular, to a connector-mount type printed circuit board.

2. Description of the Related Art

In a connector-mount printed circuit board technique, the contacts of the connector are each mounted on a solder pad provided over the printed circuit board or the contacts of the connector are each inserted into a corresponding through hole provided in the printed circuit board. That circuit pattern and contacts are soldered for electrical connection.

Aligning a greater number of contacts accurately with solder pads or through holes prior to a soldering step involves a complex, delicate operation and hence reduces operation efficiency.

Upon the soldering of the contacts of the connector to the circuit pattern, the contacts are sometimes liable to be soldered to a location misaligned with the solder pad, or cannot be uniformly joined by a soldering step at all times, because the contact is temporarily not set relative to the solder pad. Further, a bridge is sometimes created across those adjacent contacts due to the deposition of excessive solder, thus short-circuiting the contact involved.

Such a misalignment and short-circuiting occur prominently in those cases, in particular, where the pitch of the adjacent contacts is finely set.

SUMMARY OF THE INVENTION

It is accordingly the object of the present invention to provide a printed circuit board which can readily set contacts in an aligned relation, upon soldering, and ensure a simpler soldering operation for terminal electrical connection without creating any solder bridge or bridges.

According to the present invention, there is provided a printed circuit board for electrically connecting to a connector having a plurality of contacts, comprising:

a laminated board;

a print circuit pattern layer provided over a surface of the laminated board, formed of conductive metal film and having a circuit pattern and a plurality of connection land portions formed continuous with the circuit pattern, the connection land portions being arranged with reference to an edge of the surface of the laminated board, one end of the connection land portions being situated a predetermined distance from the edge of the surface of the laminated board; and a solder mask layer covering the surface of the print circuit pattern layer and covering the surfaces of the connection land portions at edges of the connection land portions excluding an edge at the one end connection land portions and portions of the solder mask layer being alternately arranged, in a stepped relation, along the edge of the surface of the laminated board, whereby the connection land portion is soldered at exposed areas thereof to a corresponding contact of the connector.

In another aspect of the present invention, there is provided a printed circuit board for electrically connecting to a connector having a plurality of contacts soldered to associated contacts of the printed circuit board, comprising:

a laminated board;

a print circuit pattern layer provided over a surface of the laminated board, formed of a conductive metal film and having a circuit pattern and a plurality of connection land portions formed continuous with the circuit pattern, the connection land portions being arranged, with reference to an edge of the surface of the laminated board such that one end of the connection land portion is situated a predetermined distance from the edge of the surface of the laminated board; and a solder mask layer covering the surface of the print circuit pattern layer and covering the connection land portions at edges of the connection land portions excluding the one end of the connection land portions, exposed portions of the connection land portions and portions of the solder mask layer being alternately arranged, in a stepped relation, along the edge of the surface of the laminated board, whereby the connection land portion is soldered at exposed areas thereof to a corresponding contact of the connector.

In this case, the connection land portions are each soldered to the corresponding contact with the contact placed on the exposed portion of the connection land portion.

Further, the solder mask layer covering the edges of the connection land portions in the printed circuit board has, at the surface of the connection land portion, a U-shaped recess which is opened at the one edge side of the laminated board.

According to the printed circuit board of the present invention, upon the soldering of the contact of the connector to the exposed area of the connection land portion of the printed circuit board, a molten solder is dammed up by the inner wall of the solder mask layer portion interposed between the adjacent land portions, preventing any solder bridge or bridges from being created across the adjacent land portion.

As the printed circuit board is opened at the one edge side, when the contacts are positioned relative to connection land portions prior to the soldering step, the inner wall of the solder mask layer portion defining the exposed area of the connection land portion serves as a guide for guiding the contact onto the connection land portion.

According to the printed circuit board of the present invention as set out above, the solder mask layers and connection land exposed portions are alternately arranged, thus ensuring the readiness with which the connection terminals are properly oriented to the connection land exposed portions upon soldering. It is, therefore, possible to prevent the formation of a solder bridge or bridges and hence a short-circuiting at the solder tails.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a perspective view showing a printed circuit board according to one embodiment of the present invention;

FIG. 2 is a top view showing the printed circuit board before mounting with a connector is performed;

FIG. 3 is a cross-sectional view as taken along line III—III in FIG. 2;

DETAILED DESCRIPTION OF THE PREFERRED EMBODIMENT

Figure 4:
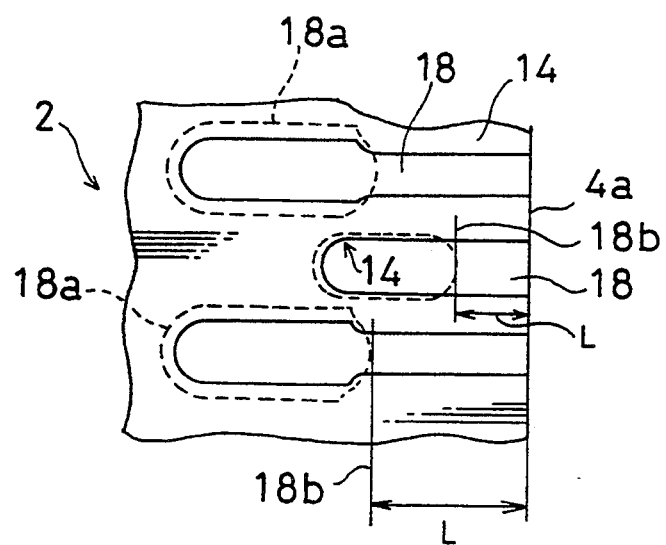
FIG. 4 is a top view showing the U-shaped recesses and connection land portions for a staggered array of solder tails.

FIG. 1 shows a printed circuit board according to an embodiment of the present invention.

The printed circuit board 2 comprises a laminated board 4, a printed circuit pattern layer 6 and a solder mask layer 8 which are sequentially stacked in that order. A connector, such as a receptacle connector and a header connector, is connected to the printed circuit board 2.

The circuit pattern layer 6 is formed of a conductive metal, usually copper, and has solder pads 10 arranged relative to planar connection land portions and a circuit pattern 12. The solder pads 10 are arranged along one edge 4a of the surface of the laminated board 4. One of four edges 10a, 10b, 10c and 10d of the respective solder pad 10 is situated adjacent the edge 4a of the laminated board 4. The width of each solder pad 10 in an array direction of the soldered pads 10 is about two times or more of a solder tail of a corresponding connector to be connected. The surface of the solder pad 10 is tin-plated.

The solder mask layer 8 is formed of a dry film solder mask made of, for example, an ultraviolet radiation hardening type photopolymer or a solder resist layer. The solder mask layer 8 covers the surface of the circuit pattern layer 6. As shown in FIG. 2 in particular, the solder mask layer 8 has a U-shaped chamfer or opening (recess) 14 at an area of the solder pad 10. The U-shaped recess 14 serves as a guide for guiding contacts of the connector.

The planar configuration of the U-shaped opening 14 is defined by an inner wall 16 of the solder mask layer 8 on the surface of the solder pad 10 and the edge 10a which is not covered by the solder mask layer 8. As shown in FIG. 2, the inner wall 16 of the U-shaped opening 14 covers the three edges 10b to 10d of the solder pad 10. The inner wall 16 of the U-shaped opening 14 serves as a solder dam for preventing a molten solder from flowing from the U-shaped opening 16.

The surface of the solder pad 10 defining the bottom of the U-shaped opening 14 provides an exposed surface not covered with the solder mask layer 8.

As shown in FIG. 3, the solder mask layer and solder pad exposed portions 8 and 18 are alternately arranged, in a stepped relation, along the edge 4a of the laminated board 4.

Figure 5:
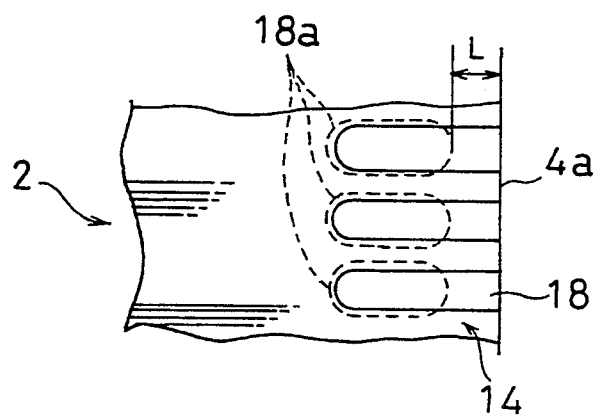
FIG. 5 is a top view showing the U-shaped recesses and connection land portions for a single array of solder tails.

FIGS. 4 and 5 show connection land portions, that is, the areas where the contact (solder tail) of the connector is to be soldered to the surface of the solder pad 10. The connection land portions corresponds to the solder pad exposed portion 18 at a surrounded area indicated by a dotted line 18a.

The connection land portion 18a is situated in a predetermined position L from the edge 4a to one end 18b of the connection land portion 18a with the edge 4a of the laminated board 4 as a reference.

Of the U-shaped opening 14, the area defined by the distance L is comprised of a guide area for guiding the solder tail onto the connection land portion 18a.

The detail configuration of the U-shaped opening 14, distance L of the guide area, array of connection land portions 18a, etc., are determined depending upon the configuration, array, etc., of the solder tails of the connector. For example, FIGS. 4 and 5 show the connection land portions 18a and U-shaped opening 14, FIG. 4 corresponding to a staggered array of tails and FIG. 5 corresponding to a single row of tails.

Mounting the connector on the printed circuit board 2 set out above will be explained below in more detail.

Figure 6:
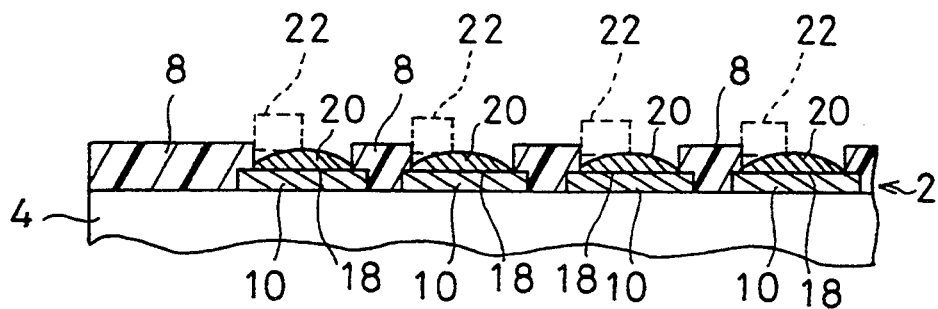
FIG. 6 is a cross-sectional view showing the solder pads and solder tails before a reflow soldering method is carried out.

As shown in FIG. 6, a solder paste 20 is printed on the solder pad exposed portion 18 in the U-shaped opening 14 prior to a soldering step. Given that the thickness of the solder mask layer 8 is, for example, about 4 mils, the thickness of the solder paste 20 is set to be about 2 to 4 mils.

A tin-plated solder tail is employed as the solder tail 22 of the connector which is to be connected to the connection land portion 18a (see FIGS. 4 and 5) of the solder pad 10. Prior to the soldering step, the solder tail 22 is inserted onto the connection land portion 18a in the U-shaped opening 14. That is, the forward end of the solder tail 22 is inserted onto the opening 14 via the edge 4a side of the laminated board 4 and hence guided onto the connection land portion 18a along one side edge of the U-shaped opening 14.

Since the U-shaped opening 14 serves as a guide area for guiding the solder tail 22 of the connector onto the connection land portion 18a, it is easy to properly orient the solder tail relative to the connection land portion 18a even if the solder tails 22 are arranged as a fine pitch array. Further, any misalignment can be avoided between the solder tail 22 and the connection land portion 18a upon soldering.

Figure 7:
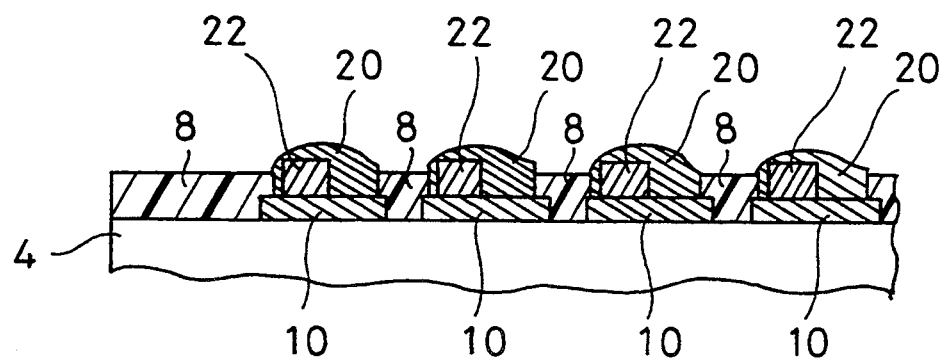
FIG. 7 is a cross-sectional view showing the solder pads and solder tails after the reflow soldering method is carried out.

As shown in FIG. 7, the solder tail 22 of the connector and connection land portion 18a of the solder pad 10 which are oriented in their position are soldered by, for example, a reflow type automatic soldering apparatus so that they are electrically and mechanically connected to each other.

Figure 8:
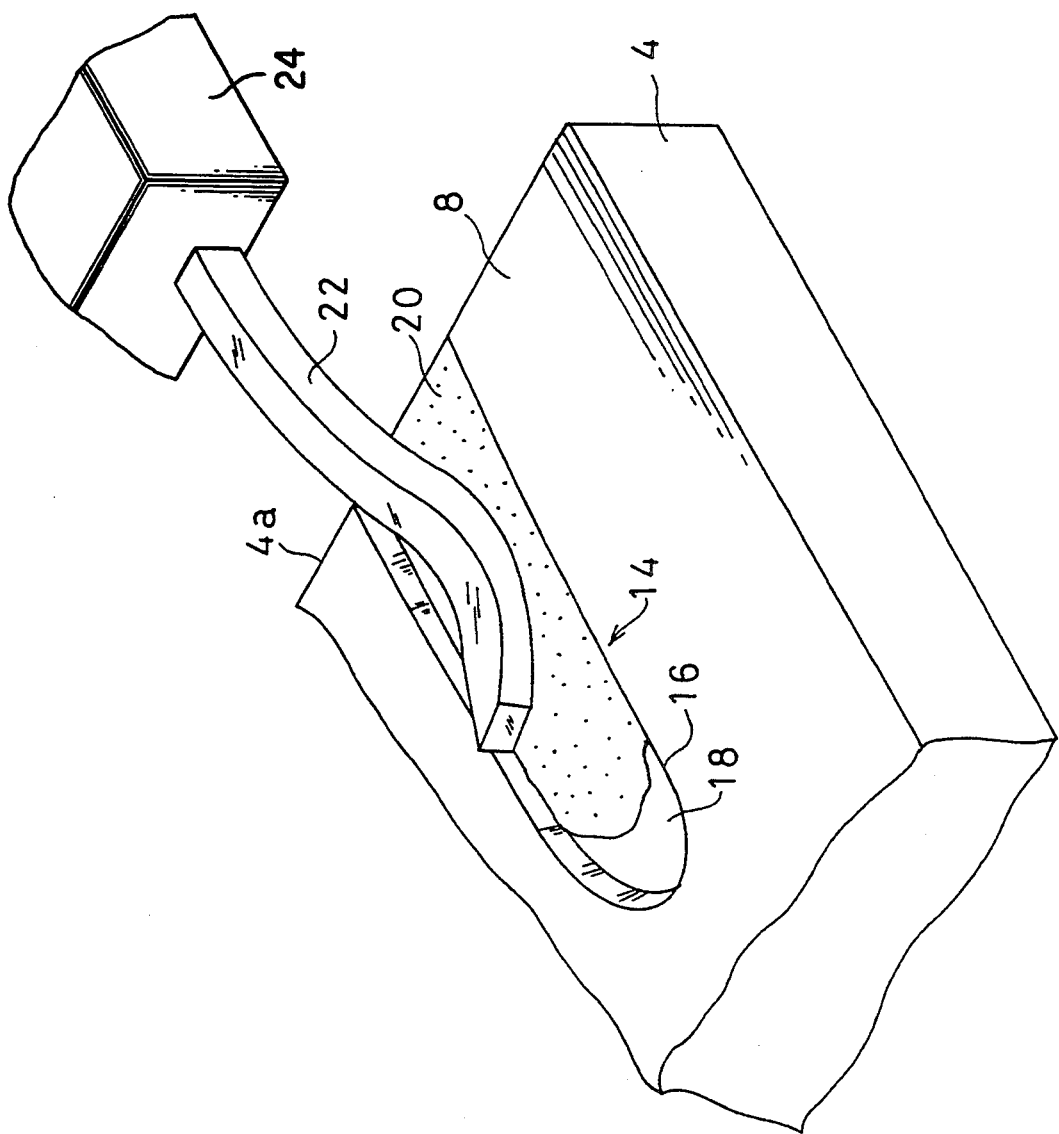
FIG. 8 is a cross-sectional view showing a solder pad and solder tail soldered together by a hand soldering operation.

Alternatively, as shown in FIG. 8, the solder paste 20 may be coated onto the solder pad exposed portion 18 and, in this case, the solder tail 22 of the connector 24 may be soldered to the connection land portion 18a manually.

In any case, a molten solder 20 in the respective U-shape opening 14 is dammed up by the inner wall 16 of the U-shape opening 14. It is thus possible to prevent leakage of the molten solder 20 into the adjacent U-shaped opening and to prevent the formation of a solder bridge or bridges which might cause a short-circuiting between the adjacent solder tails 22.

Although the present invention has been explained as being one embodiment, it is not restricted to this embodiment. For example, the details of the solder pad 10, such as its configuration, are not restricted to the ones illustrated and explained above.

What is claimed is:

1. A printed circuit board for electrically connecting to a connector having a plurality of contacts, comprising:

a laminated board;

a print circuit pattern layer provided over a surface of the laminated board, formed of conductive film and having a circuit pattern and a plurality of connection land portions formed continuous with the circuit pattern, the connection land portions being arranged with reference to an edge of the surface of the laminated board, one end of the connection land portions being situated a predetermined distance from the edge of the surface of the laminated board; and a solder mask layer covering the surface of the printed circuit pattern layer and covering the surfaces of the connection land portions at edges of the connection land portions excluding an edge at said one end of the connection land portions, said solder mask layer having, at the surface of the connection land portions, U-shaped recesses which are opened at said edge of the surface of said laminated board, and exposed portions of the connection land portions and portions of the solder mask layer being alternately arranged along the edge of the surface of said laminated board, whereby each connection land portion is soldered at exposed areas thereof to a corresponding contact of the connector.

2. A printed circuit board for electrically connecting to a connector having a plurality of contacts soldered to associated contacts of the printed circuit board, comprising:

a laminated board;

a print circuit pattern layer provided over a surface of the laminated board, formed of a conductive film and having a circuit pattern and a plurality of connection land portions formed continuous with the circuit pattern, the connection land portions being arranged with reference to an edge of the surface of the laminated board such that one end of the connection land portions is situated a predetermined distance from the edge of the surface of the laminated board; and a solder mask layer covering the surface of the print circuit pattern layer and covering the surfaces of the connection land portions at edges of the connection land portions excluding said one end of the connection land portions, said solder mask layer having, at the surfaces of the connection land portions, U-shaped recesses which are opened at said edge of the surface of said laminated board, and exposed portions of the connection land portions and portions of the solder mask layer being alternately arranged along said edge of the surface of the laminated board, whereby each connection land portion is soldered at exposed areas thereof to a corresponding contact of the connector.

3. The printed circuit board according to claim 2, wherein the connection land portions are each soldered to the associated contact of the connector, with the associated contacts being placed on the exposed portions of the connection land portions.

* * * * *

UNITED STATES PATENT AND TRADEMARK OFFICE
CERTIFICATE OF CORRECTION

PATENT NO. : 5,386,087
DATED : January 31, 1995
INVENTOR(S) : Chen W. Lee, Fong P. Chang and Chou L. Chen It is certified that error appears in the above-indentified patent and that said Letters Patent is hereby corrected as shown below:

On the title page, item [56]: under References Cited, the following patent should appear:

References Cited
U.S. PATENT DOCUMENTS 4,303,291  12/1/81   Dines                                   339/17

Signed and Sealed this

Eighteenth Day of June, 1996

*Attest:*

BRUCE LEHMAN

*Attesting Officer*     *Commissioner of Patents and Trademarks*